(12) United States Patent
Watanabe et al.

(10) Patent No.: US 6,335,298 B1
(45) Date of Patent: Jan. 1, 2002

(54) INSULATING GLASS PASTE AND THICK-FILM CIRCUIT COMPONENT

(75) Inventors: Shizuharu Watanabe, Omihachiman; Hiroshi Takagi, Otsu; Koichi Ishida, Fukui-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/459,828

(22) Filed: Dec. 13, 1999

(30) Foreign Application Priority Data

Jan. 13, 1999 (JP) .......................................... 11-006124

(51) Int. Cl.[7] .............................. B32B 3/00; C03C 3/100
(52) U.S. Cl. .............................. 501/11; 501/14; 501/18; 501/20; 428/210
(58) Field of Search .............................. 501/11, 14, 18, 501/20; 428/210

(56) References Cited

U.S. PATENT DOCUMENTS

| | | | | |
|---|---|---|---|---|
| 3,787,218 A | * | 1/1974 | Dietz et al. ................. 106/39.5 |
| 5,021,194 A | * | 6/1991 | Watanabe et al. ...... 252/519.32 |
| 5,057,378 A | * | 10/1991 | Nishino et al. .............. 428/209 |
| 5,114,885 A | * | 5/1992 | Horadaly ...................... 501/16 |
| 5,137,848 A | * | 8/1992 | Barker et al. .................. 501/18 |
| 5,179,047 A | * | 1/1993 | Chiba ........................... 501/15 |
| 5,296,414 A | * | 3/1994 | Nakagawa et al. ........... 501/20 |
| 5,763,339 A | * | 6/1998 | Asada et al. .................. 501/17 |
| 5,782,945 A | * | 7/1998 | Gavin et al. .................. 501/17 |
| 5,968,858 A | * | 10/1999 | Kawakami et al. ........... 501/15 |

* cited by examiner

*Primary Examiner*—Cathy Lam
(74) *Attorney, Agent, or Firm*—Ostrolenk, Faber, Gerb & Soffen, LLP

(57) ABSTRACT

Disclosed is an insulating glass paste capable of forming an over glaze layer having a low rate of occurrence of cracks and excellent reliability. The insulating glass paste is used for forming an over glaze layer on an insulating substrate exhibits a fracture toughness strength of about $1.0 \, MN/m^{3/2}$ or more after burning.

8 Claims, 4 Drawing Sheets

INSULATING GLASS PASTE AND THICK-FILM CIRCUIT COMPONENT

BACKGROUND OF THE INVENTION

1. Field of the Invention

The present invention relates to insulating glass paste for forming an over glaze layer, and a thick-film circuit component using the insulating glass paste.

2. Description of the Related Art

In a thick-film circuit component of a hybrid IC or the like, the technique of forming thick-film patterns of thick-film conductors, thick-film resistors, etc. on an insulating substrate is brought into practical use. Particularly, a screen printing method is used for many purposes in order to miniaturize and make the thick-film conductors, thick-film resistors, etc., fine lined An example of thick-film multilayered circuit components using the thick-film forming technique is described with reference to FIG. 1.

In a thick-film multilayered circuit component 20 comprising an insulating substrate 11 made of alumina or the like, a plurality of first thick-film conductors 12 are printed as wiring on an insulating substrate 11 by screen printing, and an interlayer insulation film 13 mainly composed of glass is formed on the first thick-film conductors 12. Furthermore, a plurality of second thick-film conductors 14 are printed as wiring on the interlayer insulation film 13, and thick-film resistors 15 are partially provided on the second thick-film conductors 14. An over glaze layer (i.e., a protective insulating glass layer) 16 is provided as an uppermost layer for protecting the thick-film conductors 14 and the thick-film resistors 15.

However, cracks 17 occurs in the over glaze layer 16 at the edges of the thick-film conductors 14, the overlap portions with the thick-film resistors 15, etc. in the thick-film multilayered circuit component 20 due to a difference in thermal expansion coefficient between the insulating substrate 11, the thick-film conductors 12, the thick-film resistors 15 or the interlayer insulating film 13 and the over glaze layer 16. The occurrence of the cracks 17 causes deterioration in conductivity of the thick-film conductors 14 or a variation in resistance of the thick-film resistors 15 due to contact of the thick-film conductors 14 and the thick-film resistors 15 with the outside air, causing deterioration in reliability of the thick-film multilayered circuit component 20.

SUMMARY OF THE INVENTION

The present invention has been achieved for solving the above problem, and an object of the present invention is to provide insulating glass paste for forming an over glaze layer, which causes less cracks in the formed over glaze.

Another object of the present invention is to provide a thick-film circuit component with high reliability, in which the occurrence of cracks in an over glaze layer is suppressed.

As a result of intensive research of the characteristics of insulating glass paste, such as the thermal expansion coefficient, Young's modulus, Vickers hardness of the over glaze layer, etc., and the rate of occurrence of cracks, the inventors found that fracture toughness strength ($K_{IC}$) after burning has a significant relation to the rate of occurrence of cracks.

Namely, the present invention relates to insulating glass paste for forming an over glaze layer, wherein fracture toughness strength after burning is about 1.0 $MN/M^{3/2}$ or more.

The insulating glass paste of the present invention may include a mixture of an amorphous glass powder, a metal oxide powder and an organic vehicle.

The insulating glass paste of the present invention may include a mixture of an crystallized glass powder and an organic vehicle.

The insulating glass paste of the present invention may include a mixture of a crystallized glass powder, a metal oxide powder, and an organic vehicle.

The present invention also provides a thick-film circuit component comprising an over glaze layer formed for protecting thick-film resistors and/or thick-film conductors provided on a substrate, wherein the over glaze layer is formed by burning the insulating glass paste of the present invention.

The insulating glass paste of the present invention exhibits a fracture toughness strength of about 1.0 $MN/m^{3/2}$ or more after burning, i.e., it can form the over glaze layer having a fracture toughness strength of about 1.0 $MN/m^{3/2}$ or more. Therefore, it is possible to form the over glaze layer in which the occurrence of cracks is suppressed by sufficiently absorbing differences between the thermal expansion coefficients of the thick-film conductors, the thick-film resistors, etc.

In the thick-film circuit component of the present invention, since the over glaze layer is formed by burning the insulating glass paste of the present invention, the occurrence of cracks in the over glaze layer is sufficiently suppressed during burning of the over glaze layer and operation of the thick-film circuit component, thereby obtaining the thick-film circuit component having high reliability.

DESCRIPTION OF THE PREFERRED EMBODIMENTS

Description will now be made of the reasons for limiting the fracture toughness strength of insulating glass paste of the present invention.

Figure 1:
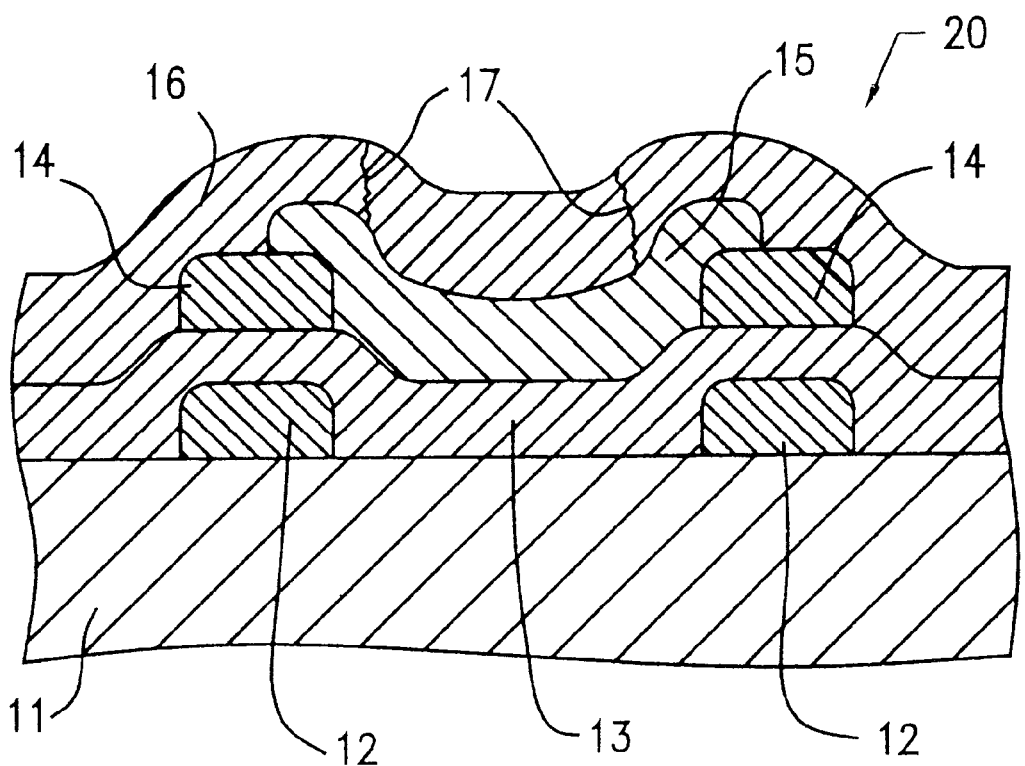
FIG. 1 is a sectional view showing a portion of a conventional thick-film multilayered circuit component.
Figure 2:
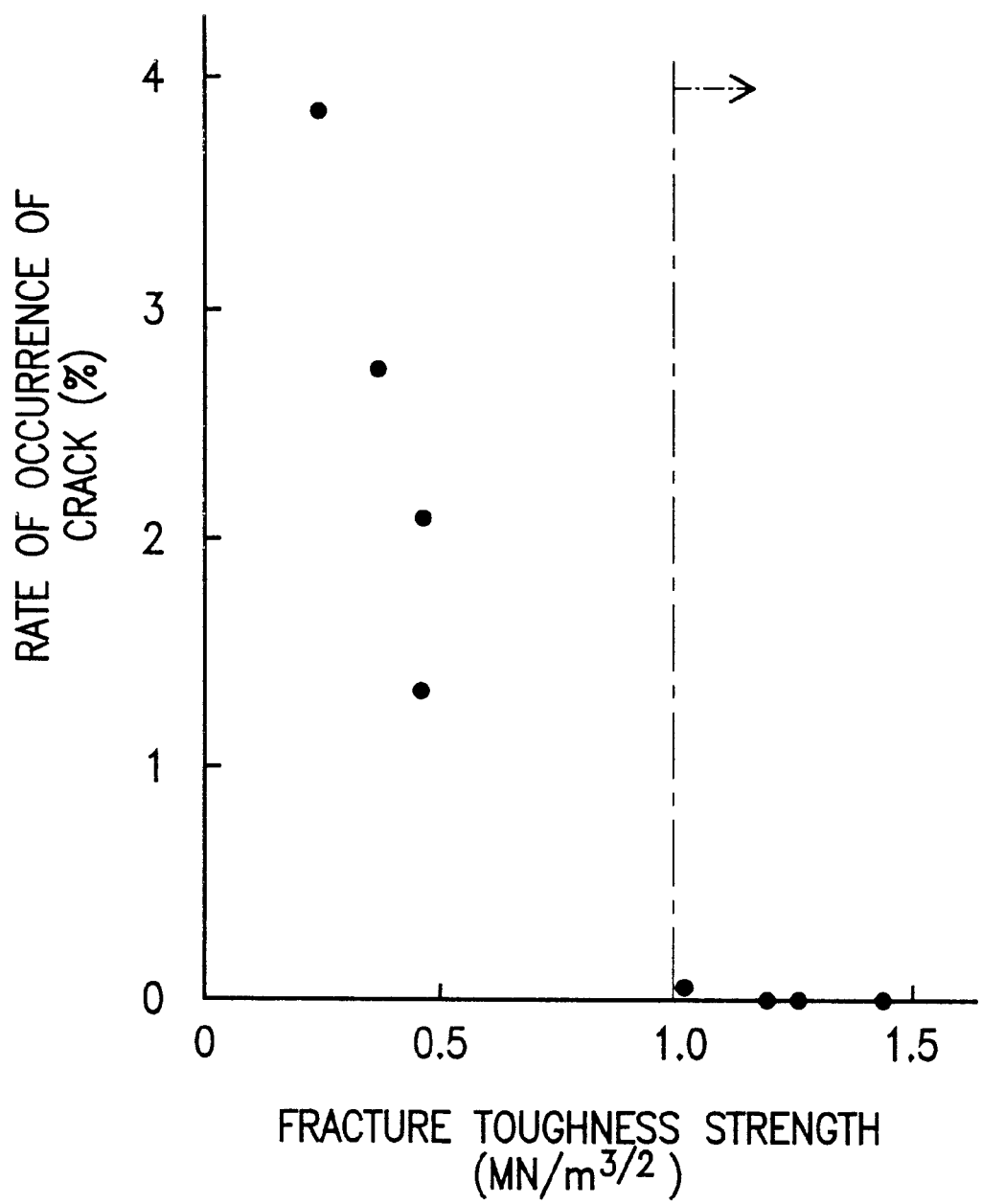
FIG. 2 is a graph showing the relation between fracture toughness strength and the rate of occurrence of cracks.

As shown in FIG. 2, the fracture toughness strength ($K_{IC}$) of an over glaze layer has a significant relation to the rate of occurrence of cracks, in which the rate of occurrence of cracks in the over glaze layer significantly changes at a fracture toughness strength of about 1.0 $MN/m^{3/2}$. With a fracture toughness strength of about 1.0 $MN/m^{3/2}$ or more, the rate of occurrence of cracks in the over glaze layer is significantly decreased. The fracture toughness strength is preferably about 1.2 $MN/m^{3/2}$ or more because the rate of occurrence of cracks is substantially zero.

This is possibly due to the fact that when the over glaze layer is formed by using insulating glass paste comprising a mixture of an amorphous glass powder, a metal oxide power and an organic vehicle, the energy at crack is absorbed in the boundaries between glass and the metal oxide powder.

It is also thought that when the over glaze layer is formed by using insulating glass paste comprising a mixture of a crystallized glass powder and an organic vehicle, the crystallized glass portions (fine crystal grains) in the over glaze layer exhibit the same function as the above-described metal oxide powder, and the energy at crack is absorbed in the boundaries between glass and the fine crystal grains.

It is further thought that when the over glaze layer is folded by using insulating glass paste comprising a mixture of a crystallized glass powder, a metal oxide powder, and an organic vehicle, the energy at crack is absorbed in the boundaries between glass and the fine metal oxide powder, as well as the boundaries between glass and the fine crystal grains.

In the insulating glass paste of the present invention, single metal oxide powders of alumina, zirconia, titania, magnesia, and the like, composite metal oxide powders of forsterite, steatite, zircon, and the like can preferably be used as the metal oxide powder. As the amorphous glass powder or crystallized glass powder, various materials can be used.

As the method of increasing the fracture toughness strength of the over glaze layer, it is possible to use various methods such as a method using an insulating glass paste comprising a mixture of an amorphous glass powder and a metal oxide powder, as described above, a method in which glass is crystallized as if a metal oxide powder is uniformly dispersed, to expect the same effect as when containing a metal oxide powder, and the like. Thus, for the insulating glass paste of the present invention, the method of setting the fracture toughness strength of the insulating glass paste after burning, i.e., the fracture toughness strength of the over glaze layer, to about 1.0 $MN/m^{3/2}$ or more is not limited.

Although a factor in setting the fracture toughness strength of the over glaze layer to the above value is the selection of the type and composition ratio of the insulating glass paste, the selection of a burning profile is also an important factor. For example, when the cooling speed of the insulating glass paste after burning is decreased, the fracture toughness strength of the resultant over glaze layer is significantly improved. This is possibly due to the fact that a decrease in the cooling speed relieves the internal stress of glass. Although a decrease in burning temperature decreases hardness due to insufficient burning of the glass, the fracture toughness strength is possibly significantly increased. Also, the fracture toughness strength of the over glaze layer possibly depends upon the sintering time (peak time).

Figure 3:
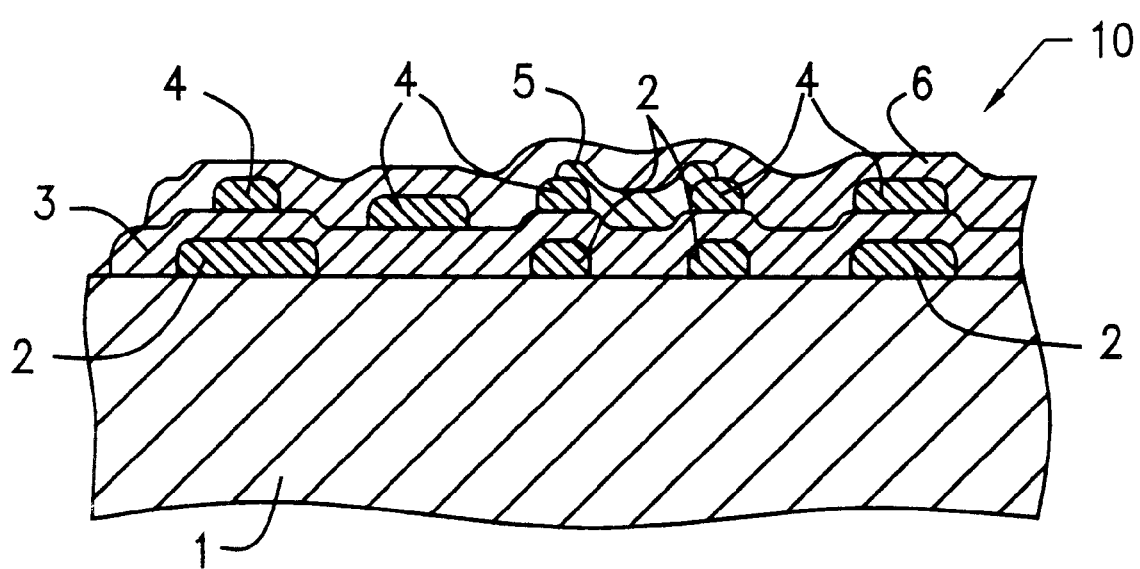
FIG. 3 is a schematic sectional view showing an example of thick-film circuit components of the present invention.

A thick-film multilayered circuit board comprising a thick-film circuit component of the present invention will be described with reference to FIG. 3.

In a thick-film multilayered circuit board 10, a plurality of first thick-film conductors 2 serving as various wirings are formed on an insulating substrate 1 made of alumina or the like, and an interlayer insulating film (under glaze layer) 3 mainly composed of glass is formed on the first thick-film conductors 2. Furthermore, a plurality of second thick-film conductors 4 serving as various wirings are formed on the interlayer insulating film 3, and thick-film resistors 5 are partially formed on the second thick-film conductors 4. Furthermore, an over glaze layer (protective insulating glass layer) 6 is formed as an uppermost layer for protecting the thick-film conductors 4 and the thick-film resistors 5.

The thick-film multilayered circuit board 10 is manufactured according to the following procedure, for example. First, a conductive paste is screen-printed on the insulating substrate 1 to form the first thick-film conductors 2, and then an insulating glass paste is screen-printed or spin-coated to form the interlayer insulating film 3. Next, a conductive paste is screen-printed on the interlayer insulating film 3 to form the second thick-film conductors 4, and then resistor paste is screen-coated to form the thick-film resistors 5. Finally, the insulating glass paste of the present invention is screen-printed or spin-coated to form the over glaze layer 6, followed by burning under predetermined burning conditions.

In the thick-film multilayered circuit board 10, the over glaze layer 6 is formed by burning the insulating glass paste of the present invention, and has a fracture toughness strength of about 1.0 $MN/m^{3/2}$ or more. Therefore, even when there are differences in thermal expansion coefficient between the thick-film conductor 4 and the over glaze layer 6, between the thick-film resistors 5 and the over glaze layer 6, etc., the occurrence of cracks in the over glaze layer 6 is suppressed. As a result, the circuit board 10 is less damaged by the outside air, particularly moisture, or the like, thereby causing less deterioration in conductivity of the thick-film conductors 4, and less variation in the resistance value of the thick-film resistors 5, obtaining a thick-film circuit component having high reliability.

The insulating substrate 1 is not limited to an alumina substrate, and various insulating substrates, particularly insulating ceramic substrates, such as $BaO—Al_2O_3—SiO_2$ system low-temperature sintered glass ceramic substrates, and the like may be used. In the thick-film circuit component of the present invention, besides the insulating ceramic substrates, dielectric ceramic substrates made of barium titanate or the like, and magnetic ceramic substrates made of ferrite or the like can be used as the substrate. In addition, passive components such as a capacitor, a coil, and the like may be inserted into the insulating substrate, or mounted components such as an IC chip and the like may be mounted on the surface of the insulating substrate.

The thick-film circuit component of the present invention may be used as a thick-film multilayered circuit board of a hybrid IC or the like, and various electronic parts such as a chip resistor, a chip coil, etc. The insulating glass paste of the present invention can be used for the over glaze layer (the protecting film provided in the uppermost layer) for chip resistors, chip coils, etc.

The thick-film conductors can be formed by printing a conductive paste composed of a conductive material such as copper, silver, gold, palladium or the like as a main component, and then burning the paste. The thick-film resistors can be formed by printing a resistor paste composed of a resistance material such as lanthanum boride or the like as a main component, and then burning the paste.

EXAMPLE

The present invention will be described below with reference to examples.

Example 1

An alumina powder having an average particle diameter ($D_{50}$) of 2.5 mm was added as a metal oxide to an amorphous glass powder having the composition described below, and an organic vehicle obtained by dissolving ethyl cellulose in α-terpineol was mixed with the resultant mixture at a ratio by weight (mixture of glass powder and metal oxide powder)/(organic vehicle) of 80/20 to produce insulating glass paste.

A conductive paste was printed on an insulating substrate 1 made of alumina to form first thick-film conductors 2 having a thickness of about 20 mm, and then a commercial insulating paste was printed to form an interlayer insulating film 3. Furthermore, second thick-film conductors 4 were formed to a thickness of about 20 mm by using a conductive paste, and thick-film resistors 5 were formed by using a resistor paste. Then, the above insulating glass paste was printed by screen printing to form an insulating glass paste layer so that the thickness of an over glaze layer after burning was about 10 mm, to form a thick-film multilayered circuit board 10 as shown in FIG. 3. Burning was carried out by using a tunnel furnace under conditions including a burning temperature in the range of 460 to 520° C., and a burning time of 10 minutes.

| Composition of Amorphous Glass Powder (molar ratio) | |
| --- | --- |
| $SiO_2$ | 8.12 |
| $B_2O_3$ | 28.07 |
| $Al_2O_3$ | 12.20 |
| BaO | 2.11 |
| PbO | 32.79 |
| ZnO | 26.66 |

The amorphous glass powder was produced by mixing precursors of the above-described composition ($H_3BO_3$ for $B_2O_3$; $Al(OH)_3$ for $Al_2O_3$; $BaCO_3$ for BaO; $Pb_3O_4$ for PbO), melting in a platinum crucible at 1000° C. to 1200° C., quenching the resultant melt, and then grinding to an average particle size of about 1.5 4 mm in a ball mill.

For the thus-obtained thick-film multilayered circuit board, the fracture toughness strength ($K_{IC}$) and the rate of occurrence of cracks of the over glaze layer were measured. The results are shown in Table 1 and FIG. 2. Table 1 also shows the amount of the alumina added to the insulating glass paste, and the burning temperature of the insulating glass paste.

Assuming that Vickers hardness was H, Young's modulus was E, the radius of a Vickers indenter was a, and the crack length immediately after the Vickers indenter was removed was $C_0$, the fracture toughness strength $K_{IC}$ was calculated according to the following equation:

$$K_{IC} = 0.028(C_0 a)^{-3/2}(H/E)^{-1/2}(H \cdot a^{1/2})$$

TABLE 1

| Example No. | Amount of alumina added (wt %) | Burning temperature (° C.) | Fracture toughness strength ($MN/m^{3/2}$) | Rate of occurrence of cracks (%) |
| --- | --- | --- | --- | --- |
| 1 | 0.0 | 520 | 0.23 | 3.82 |
| 2 | 5.0 | 480 | 0.44 | 1.38 |
| 3 | 5.0 | 520 | 0.35 | 2.77 |
| 4 | 10.0 | 460 | 1.02 | 0.10 |
| 5 | 10.0 | 520 | 0.46 | 2.15 |
| 6 | 15.0 | 480 | 1.23 | 0.00 |

Table 1 and FIG. 2 indicate that the fracture toughness strength depends upon the amount of the alumina powder added and the burning temperature. As the amount of the alumina powder added increases and the burning temperature increases, the fracture toughness strength increases. It is also found that with a fracture toughness strength of about 1.0 ($MN/m^{3/2}$) or more, the rate of occurrence of cracks is decreased to a practical level.

Specifically, comparison of Examples 4 and 5 reveals that as the burning temperature decreases, the fracture toughness strength increases. Also comparison of Examples 2, 4 and 6 reveals that as the amount of the alumina powder added increases, the fracture toughness strength increases. However, comparison of Examples 2 and 3 reveals that desired fracture toughness strength cannot be obtained only by decreasing the burning temperature, and control of various parameters such as the amount of the metal oxide added, etc. are required. In this Example 1, a sufficient fracture toughness strength was not obtained by the insulating glass paste comprising a mixture of the amorphous glass and the organic vehicle only.

Example 2

An insulating glass paste comprising a mixture of a crystallized glass powder, a composite metal oxide powder and an organic vehicle was used for forming an over glaze layer to produce the same thick-film multilayered circuit board as Example 1. However, the insulating glass paste in this example, was formed by mixing a commercial glass, AP-5551 (produced by Asahi Glass Co., Ltd.), as the crystallized glass powder, and forsterite having an average particle diameter of 2.0 mm as the composite metal oxide powder with the same organic vehicle as Example 1.

For the thus-obtained thick-film multilayered circuit board, the fracture toughness strength ($K_{IC}$) and the rate of occurrence of cracks of the over glaze layer were measured in the same manner as Example 1. The results are shown in Table 2 and FIG. 2. Table 2 also shows the amount of forsterite added to the insulating glass paste and the burning temperature of the insulating glass paste.

TABLE 2

| Example No. | Amount of forsterite added (wt %) | Burning temperature (° C.) | Fracture toughness strength ($MN/m^{3/2}$) | Rate of occurrence of cracks (%) |
| --- | --- | --- | --- | --- |
| 7 | 0.0 | 540 | 1.27 | 0.00 |
| 8 | 5.0 | 540 | 1.43 | 0.00 |

Example 7 indicates that even with no metal oxide powder added, the crystallized glass system used exhibits a fracture toughness strength of more than 1.0 and a rate of occurrence of cracks of zero. Example 8 indicates that by adding the composite metal oxide powder to the crystallized glass, the fracture toughness strength is further increased, and, like in Example 7, the rate of occurrence of cracks is zero.

Therefore, the above-described examples reveal that with insulating glass paste having a fracture toughness strength of abpit 1.0 $MN/m^{3/2}$ or more, preferably about 1.2 $MN/M^{3/2}$ or more, after burning, the occurrence of cracks can be substantially prevented even if the over glaze layer is formed on a surface with high unevenness.

Figure 4:
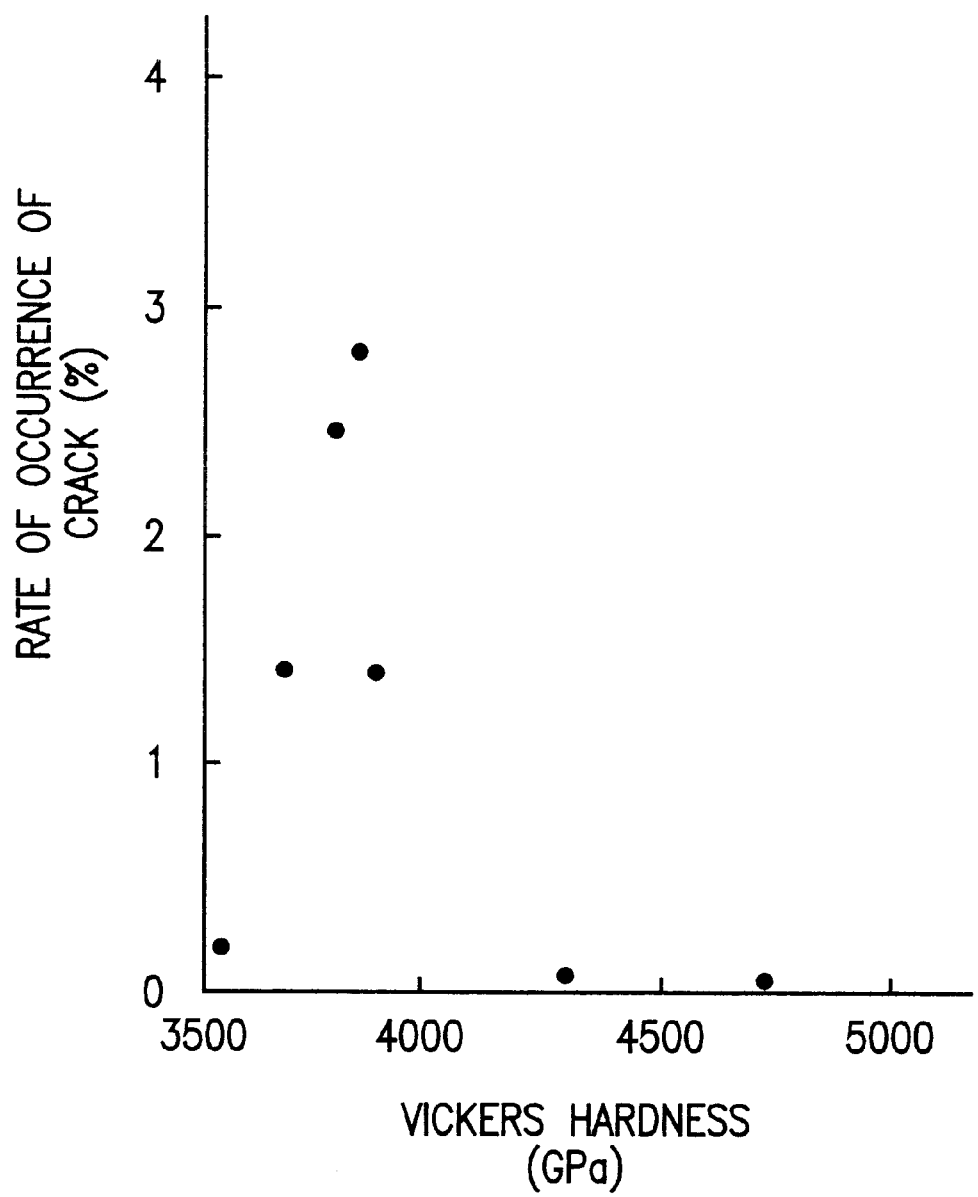
FIG. 4 is a graph showing the relation between Vickers hardness and the rate of occurrence of cracks.

For comparison, various types of insulating glass pastes were used to form over glaze layers on thick-film multilayered circuit boards having the same construction as described above. For the glaze layers, the relation between Vickers hardness and the rate of occurrence of cracks was examined. The measurement results are shown in FIG. 4. In this measurement, the thickness of the over glaze layer was about 40 mm and Vickers hardness was measured by using a Vickers hardness meter (a load of 100 g).

FIG. 4 indicates that the over glaze layer has substantially no correlation between the Vickers hardness and the rate of occurrence of cracks. It is found that in the over glaze layer provided in the thick-film multilayered circuit board, the rate of occurrence of cracks greatly depends upon the fracture toughness strength.

The insulating glass paste of the present invention causes sufficient absorption of differences in thermal expansion coefficient between thick-film conductors, thick-film resistors, etc., by the over glaze layer, thereby sufficiently suppressing the occurrence of cracks in the over glaze layer.

In the thick-film circuit component of the present invention, since an over glaze layer is formed by burning the insulating glass paste of the present invention, the occurrence of cracks in the over glaze layer is suppressed in burning and in the operation of the thick-film circuit component, thereby obtaining the thick-film circuit component having high reliability.

While the invention has been particularly shown and described with reference to preferred embodiments thereof, it will be understood by those skilled in the art that the forgoing and other changes in form and details may be made therein without departing from the spirit of the invention.

What is claimed is:

1. A thick-film circuit component comprising a thick-film resistor on a substrate and a 460–540° C. burned over glaze layer thereon, wherein the over glaze layer has a fracture toughness strength after burning of about 1.0 $MN/m^{3/2}$ or more.

2. A thick-film circuit component according to claim 1, wherein the over glaze layer comprises amorphous glass and metal oxide.

3. A thick-film circuit component according to claim 1, wherein the over glaze layer comprises crystallized glass.

4. A thick-film circuit component according to claim 1, wherein the over glaze layer comprises crystallized glass and metal oxide.

5. A thick-film circuit component according to claim 4, wherein the fracture toughness strength is at least about 1.2 $MN/m^{3/2}$.

6. A thick-film circuit component according to claim 3, wherein the fracture toughness strength is at least 1.2 $MN/m^{3/2}$.

7. A thick-film circuit component according to claim 2, wherein the fracture toughness strength is at least 1.2 $MN/m^{3/2}$.

8. A thick-film circuit component according to claim 1, wherein the fracture toughness strength is at least 1.2 $MN/m^{3/2}$.

* * * * *